United States Patent
Kashefi et al.

(10) Patent No.: US 11,955,382 B2
(45) Date of Patent: Apr. 9, 2024

(54) REVERSE SELECTIVE ETCH STOP LAYER

(71) Applicant: Applied Materials, Inc., Santa Clara, CA (US)

(72) Inventors: Kevin Kashefi, San Ramon, CA (US); Alexander Jansen, San Jose, CA (US); Mehul Naik, San Jose, CA (US); He Ren, San Jose, CA (US); Lu Chen, Cupertino, CA (US); Feng Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 196 days.

(21) Appl. No.: 17/110,818

(22) Filed: Dec. 3, 2020

(65) Prior Publication Data
US 2022/0181204 A1    Jun. 9, 2022

(51) Int. Cl.
*H01L 21/76* (2006.01)
*H01L 21/67* (2006.01)
*H01L 21/768* (2006.01)
*H01L 21/687* (2006.01)

(52) U.S. Cl.
CPC .. *H01L 21/76885* (2013.01); *H01L 21/67167* (2013.01); *H01L 21/67207* (2013.01); *H01L 21/76829* (2013.01); *H01L 21/76883* (2013.01); *H01L 21/68707* (2013.01)

(58) Field of Classification Search
CPC ......... H01L 21/76885; H01L 21/67167; H01L 21/67207; H01L 21/76829; H01L 21/76883; H01L 21/68707; H01L 21/76897
See application file for complete search history.

(56) References Cited

U.S. PATENT DOCUMENTS

| 6,785,159 | B2 | 8/2004 | Tuttle |
| 6,900,539 | B2 | 5/2005 | Motoyama |
| 8,232,148 | B2 | 7/2012 | Li et al. |
| 8,357,609 | B2 | 1/2013 | Ryan |
| 9,299,704 | B2 | 3/2016 | Ji et al. |
| 9,362,385 | B2 | 6/2016 | Cheng et al. |
| 9,793,156 | B1 * | 10/2017 | Yang ................ H01L 21/76838 |
| 10,629,484 | B1 * | 4/2020 | Parikh .............. H01L 21/76877 |
| 10,643,895 | B2 | 5/2020 | Mebarki et al. |

(Continued)

FOREIGN PATENT DOCUMENTS

| CN | 1838408 A * | 9/2006 | ....... H01L 21/76808 |
| CN | 106601664 A | 4/2017 | |

(Continued)

OTHER PUBLICATIONS

PCT International Search Report and Written Opinion in PCT/US2021/061807 dated Mar. 23, 2022, 11 pages.

*Primary Examiner* — Mohammed Shamsuzzaman
(74) *Attorney, Agent, or Firm* — Servilla Whitney LLC (57) ABSTRACT

Methods and apparatus for forming a reverse selective etch stop layer are disclosed. Some embodiments of the disclosure provide interconnects with lower resistance than methods which utilize non-selective (e.g., blanket) etch stop layers. Some embodiments of the disclosure utilize reverse selective etch stop layers within a subtractive etch scheme. Some embodiments of the disclosure selectively deposit the etch stop layer by passivating the surface of the metal material.

18 Claims, 6 Drawing Sheets

(56) References Cited

U.S. PATENT DOCUMENTS

| | | |
|---|---|---|
| 2007/0238279 A1 | 10/2007 | Cerio, Jr. |
| 2007/0249156 A1* | 10/2007 | Bonilla ............. H01L 21/02074 257/E21.241 |
| 2009/0250815 A1 | 10/2009 | Yang et al. |
| 2011/0115005 A1* | 5/2011 | Coolbaugh ......... H01L 27/0629 257/296 |
| 2013/0313648 A1 | 11/2013 | Chiang et al. |
| 2017/0110397 A1* | 4/2017 | Wu ................... H01L 21/02282 |
| 2017/0125340 A1* | 5/2017 | Tsai .................. H01L 21/02178 |
| 2020/0006083 A1* | 1/2020 | Huang ................ H01L 21/0337 |
| 2020/0006138 A1* | 1/2020 | Lin ....................... H01L 23/528 |
| 2020/0006228 A1* | 1/2020 | Yang ................ H01L 21/76832 |
| 2020/0105592 A1* | 4/2020 | Kuo .................... H01L 23/5226 |
| 2020/0251340 A1 | 8/2020 | Shaviv et al. |
| 2020/0395535 A1* | 12/2020 | Liao .................... H01F 10/3254 |
| 2021/0249351 A1* | 8/2021 | Anderson ......... H01L 21/76877 |
| 2021/0398898 A1* | 12/2021 | Yang .................... H01L 23/5222 |
| 2022/0285216 A1* | 9/2022 | Chen ................. H01L 21/76883 |
| 2023/0138988 A1* | 5/2023 | Motoyama .......... H01L 23/5226 257/774 |

FOREIGN PATENT DOCUMENTS

| | | | | |
|---|---|---|---|---|
| CN | 107180786 A | | 9/2017 | |
| CN | 110660660 A | | 1/2020 | |
| CN | 112563328 A | * | 3/2021 | ....... H01L 21/76816 |
| JP | H1167907 A | | 3/1999 | |
| JP | 2018137435 A | | 8/2018 | |
| JP | 2020507923 A | | 3/2020 | |
| KR | 100936490 B1 | | 1/2010 | |
| KR | 20200050405 A | | 5/2020 | |
| TW | 201725606 A | * | 7/2017 | ....... H01L 21/02126 |
| WO | 2020227274 A1 | | 11/2020 | |
| WO | WO-2021262527 A1 | * | 12/2021 | ....... H01L 21/02126 |

* cited by examiner

FIG. 1A
Amended

FIG. 1B
Amended

FIG. 7A
New

FIG. 7B
New

FIG. 7C
New

FIG. 7D
New

FIG. 7E
New

REVERSE SELECTIVE ETCH STOP LAYER

TECHNICAL FIELD

Embodiments of the disclosure generally relate to methods for deposition and integration of reverse selective etch stop layers. In particular, embodiments of the disclosure relate to a subtractive etch using a reverse selective etch stop layer.

BACKGROUND

Three dimensional features are an integral part of semiconductor products. Trenches, vias, and holes allow for the layering and connection of conductive patterns. These features are often formed by etch processes which rely on certain materials which are more resistant to the etch process than other surrounding materials. These resistant materials are referred to as etch stop layers, as the etch process "stops" at this layer.

Subtractive etch processes are methods for forming material patterns in which a blanket layer of material is deposited and then selectively removed to form the final pattern. Subtractive etch process are different from additive processes in which the final pattern is deposited where required. Subtractive etch processes rely on etch stop layers to prevent the etch process from damaging any underlying materials during the formation of the final pattern.

During the formation of connections between multiple layers of conductive patterns, it is often the case that a metal material in a via will extend from one layer towards an adjacent layer. In fabrication is it essential that the adjacent layer connects with this filled via. The etch processes described above are particularly useful in ensuring that the patters between multiple layer connect well.

But the etch stop materials are not highly conductive. Accordingly, when etch stop layers are used to aid in the fabrication of interconnects, it can be detrimental to the device performance as the etch stop layer increases the resistance at the connection between the two metal materials.

Accordingly, there is a need for selective deposition of etch stop layers on dielectric materials with little to no deposition on metallic materials.

SUMMARY

One or more embodiments of the disclosure are directed to a method comprising selectively depositing an etch stop layer on a substrate surface comprising a first dielectric material with a plurality of feature formed therein and a first metal material within the features. The etch stop layer is deposited on the surface of the first dielectric material over the surface of the first metal material. A second metal material is deposited on the surface of the first metal material and the etch stop layer. The second metal material is etched to expose portions of the etch stop layer.

Additional embodiments of the disclosure are directed to a method comprising exposing a substrate comprising a first dielectric material with a plurality of features formed therein and a first metal material within the features to a blocking compound to form a passivated surface of the first metal material. An etch stop layer is selectively deposited on the first dielectric material over the passivated surface of the first metal material. The blocking compound is removed from the surface of the first metal material. A second metal material is deposited on the surface of the first metal material and the etch stop layer. The second metal material is etched by photolithography to expose the etch stop layer and form a conductive path between the first metal material within at least two of the features. Exposed portions of the etch stop layer are removed.

Further embodiments of the disclosure are directed to a processing system comprising a central transfer station having a robot therein configured to move one or more substrate between chambers connected to the central transfer station. A first processing chamber is connected to the central transfer station and configured to selectively deposit an etch stop layer on the substrate. A second processing chamber is connected to the central transfer station and configured to deposit a metal material. A third processing chamber is connected to the central transfer station and configured to etch metal materials. A control system is coupled to the central transfer station and the first, second, and third processing chambers. The control system comprises a first configuration to move the substrate between the first, second and third processing chambers, a second configuration to provide one or more process gases to the first processing chamber to selectively deposit the etch stop layer, a third configuration to provide one or more process gases to the second processing chamber to deposit the metal material, and a fourth configuration to provide one or more process gases to the third processing chamber to etch metal materials.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A-4A and 4C are cross-sectional views of an exemplary substrate during processing according to one or more embodiment of the disclosure;

FIGS. 1B-4B and 4D are top views of an exemplary substrate during processing according to one or more embodiment of the disclosure;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for the deposition and integration of reverse selective etch stop layers. Some embodiments of the disclosure advantageously provide metallic interconnects with lower resistance. Some embodiments of the disclosure provide metallic interconnects with less interface electron scattering. Some embodiments of the disclosure provide resistance benefits to subtractive etch schemes.

Referring to FIGS. 1-5, an exemplary substrate 100 is shown during processing by a method 500 of the disclosure. For reference, figures with the A label (e.g., FIG. 1A) are side views of the substrate 100 along the line A-A'. Figures with the B label (e.g, FIG. 1B) are top views of the substrate 100.

Figure 1A:
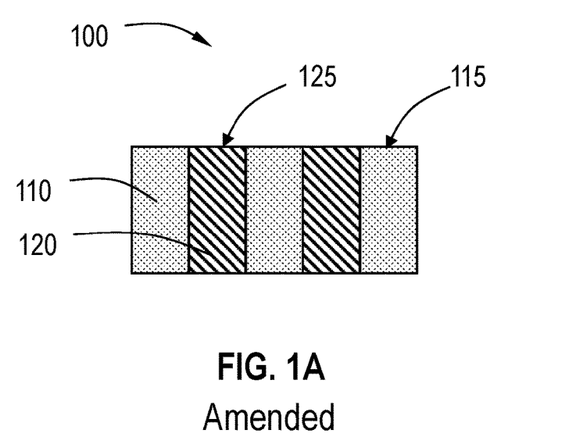
Figure 1B:
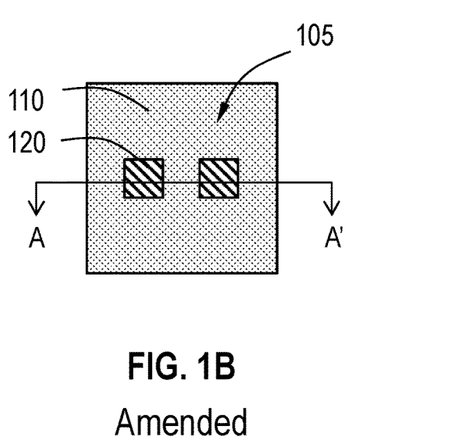

Referring to FIGS. 1A and 1B, the substrate 100 comprises a first dielectric material 110 and a first metal material 120. The surface 105 of the substrate has a plurality of features formed therein. The first metal material 120 is within the features. In some embodiments, as shown, the feature is a via. In some embodiments, not shown, the feature is a trench.

In some embodiments, as shown, the surface 125 of the first metal material 120 is substantially coplanar with the surface 115 of the first dielectric material. In some embodiments, the first metal material 120 does not completely fill the feature. Stated differently, in some embodiments, the first metal material 120 is recessed relative to the surface of the first dielectric material 110.

The first dielectric material 110 may be any suitable dielectric material. In some embodiments, the first dielectric material 110 is a low-k dielectric material. In some embodiments, the first dielectric material 110 comprises silicon oxide, silicon nitride, silicon carbide or combinations thereof. In some embodiments, the first dielectric material 110 consists essentially of silicon oxide. In some embodiments, the first dielectric material 110 consists essentially of a low-k dielectric material. As used in this regard, a material which "consists essentially of" a stated material comprises greater than or equal to 98%, greater than or equal to 99%, greater than or equal to 99.5%, or greater than or equal to 99.9% on an atomic basis, excluding hydrogen.

The first metal material 120 may be any suitable conductive material. In some embodiments, the first metal material 120 comprises one or more of copper, cobalt, tungsten, ruthenium, or molybdenum. In some embodiments, the first metal material 120 consists essentially of copper.

Figure 2A:
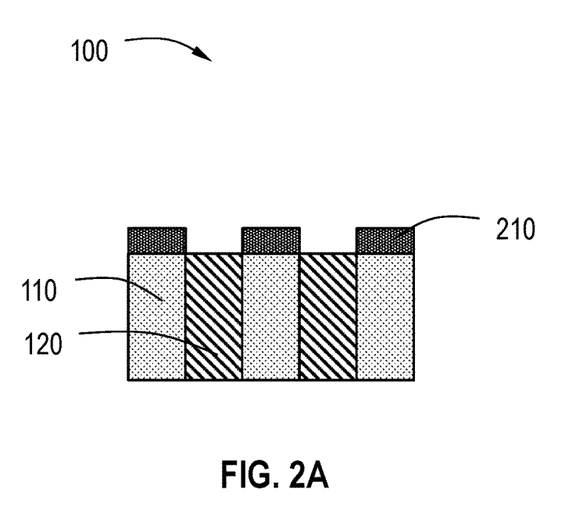
Figure 2B:
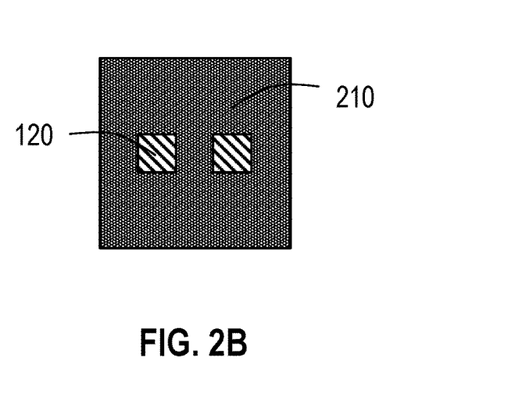
Figure 5:
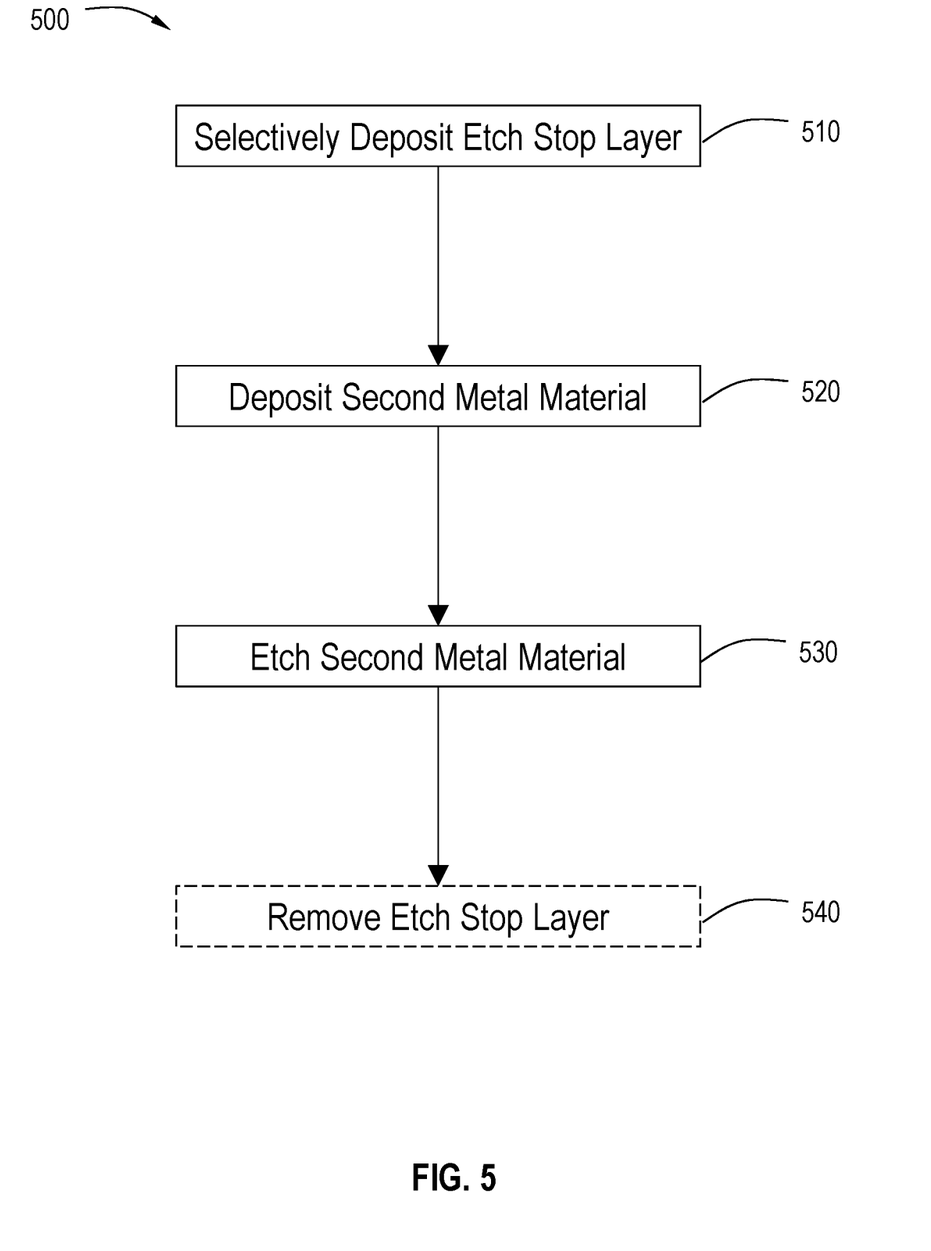
FIG. 5 is a flow chart of an exemplary processing method according to one or more embodiment of the disclosure.

At operation 510, an etch stop layer 210 is selectively deposited on the substrate surface 105. The etch stop layer 210 is selectively deposited on the surface of the first dielectric material 110 over the surface of the first metal material 120. The etch stop layer 210 may be any suitable etch stop, including, but not limited to, tantalum nitride (TaN), titanium nitride (TiN) or aluminum oxide ($Al_2O_3$).

As used in this specification and the appended claims, the term "selectively depositing on a first surface over a second surface", and the like, means that a first amount of a film or layer is deposited on the first surface and a second amount of film or layer is deposited on the second surface, where the second amount of film is less than the first amount of film, or in some cases no film is deposited on the second surface.

The term "over" used in this regard does not imply a physical orientation of one surface on top of another surface but rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some embodiments, "selectively" means that the subject material forms on the target surface at a rate greater than or equal to about 2×, 3×, 4×, 5×, 7×, 10×, 15× or 20× the rate of formation on the non-selected surface. Stated differently, the selectivity for the target material surface relative to the non-selected surface is greater than or equal to about 2:1, 3:1, 4:1, 5:1, 7:1, 10:1, 15:1, 20:1, 50:1, 100:1, 200:1, or 500:1. In some embodiments, the etch stop layer is deposited with a selectivity greater than or equal to 5.

Several embodiments of the disclosure are described as "reverse selective" deposition processes, or the deposited films described as "reverse selective" films. The first selective processes deposited on metal material over dielectric materials. However, as time has gone on, the reverse has also been observed. Accordingly, as used in this regard, a "reverse selective" process deposits more material on a dielectric surface than a metallic surface.

In some embodiments, selectively depositing the etch stop layer 210 at operation 510 comprises exposing the substrate to a blocking compound to form a passivated surface of the first metal material. The etch stop layer 210 is deposited on the first dielectric material 110 over the passivated surface of the first metal material 120.

In some embodiments, the blocking compound comprises one or more of a phosphoric acid, alkyl silane, halogenated silane, thiol or unsaturated hydrocarbon. In some embodiments, the blocking compound comprises or consists essentially of 3-hexyne.

In some embodiments, when a blocking compound is used, the method 500 further comprises removing the blocking compound from the passivated surface of the first metal material 120. In some embodiments, the blocking compound may be removed by a physical process (e.g., thermal decomposition, etch or surface sputtering). In some embodiments, the blocking compound is removed by a chemical process (e.g. plasma or thermal treatments utilizing $H_2$, $O_2$, $NH_3$ or fluorine-based reactants).

Figure 3A:
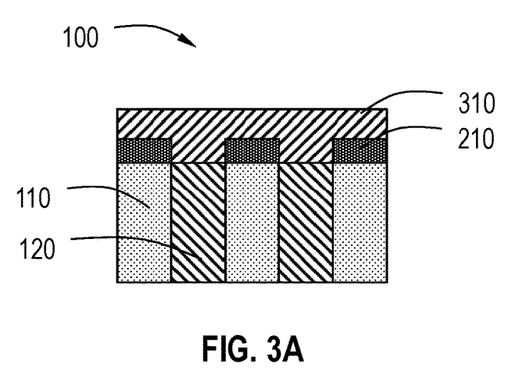
Figure 3B:
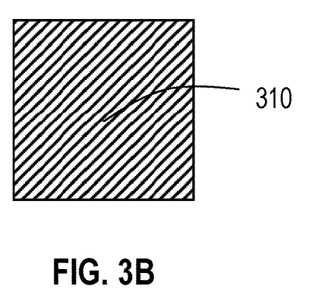
Figure 4A:
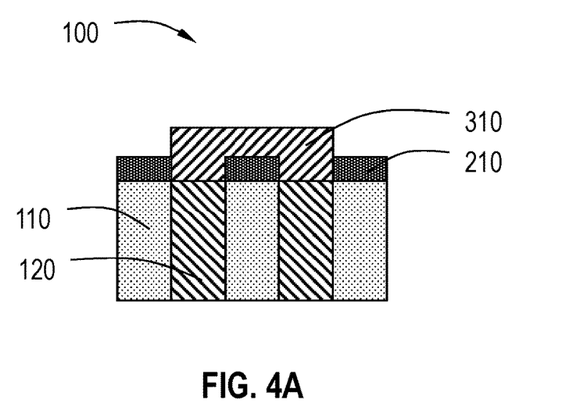
Figure 4B:
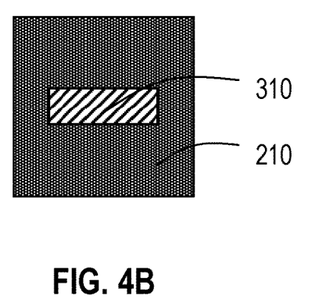
Figure 4C:
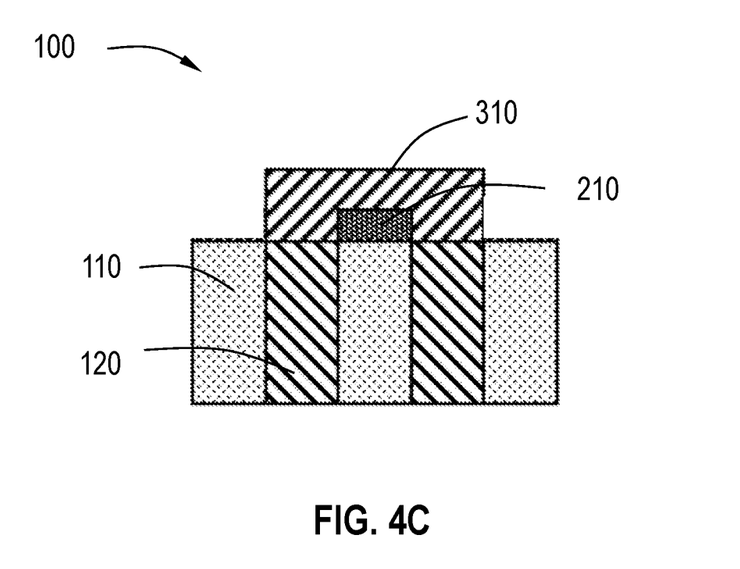
Figure 4D:
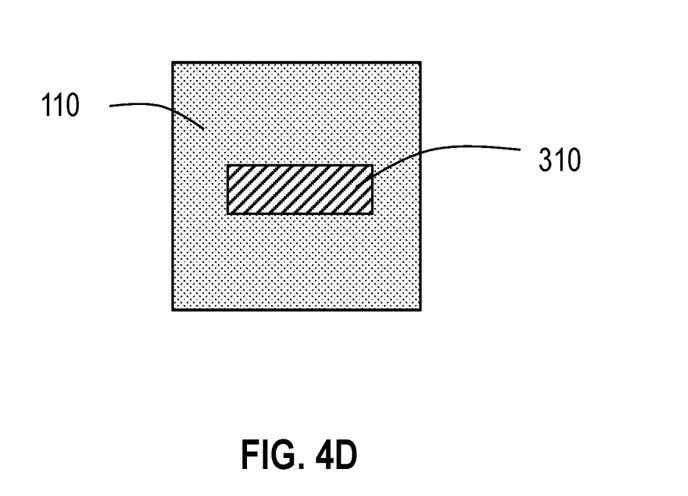

At operation 520, a second metal material 310 is deposited on the surface of the first metal material 120 and the etch stop layer 210. In some embodiments, the second metal material 310 covers the substrate surface 105. In some embodiments, when the first metal material 120 is recessed below the first dielectric material 110, the second metal material 310 fills the plurality of features.

In some embodiments, the first metal material and the second metal material are different materials. In some embodiments, the first metal material and the second metal material are the same material. In some embodiments, the second metal material 310 comprises one or more of copper, cobalt, tungsten, ruthenium, or molybdenum. In some embodiments, the second metal material 310 consists essentially of copper.

At operation 530, the second metal material 310 is etched to expose portions of the etch stop layer 210. In some embodiments, etching the second metal material 310 forms a conductive path between the first metal material 120 within at least two of the features. In some embodiments, etching the second metal material comprises a photolithography process. In some embodiments, at option operation 540, the exposed portions of the etch stop layer 210 are removed.

Figure 6:
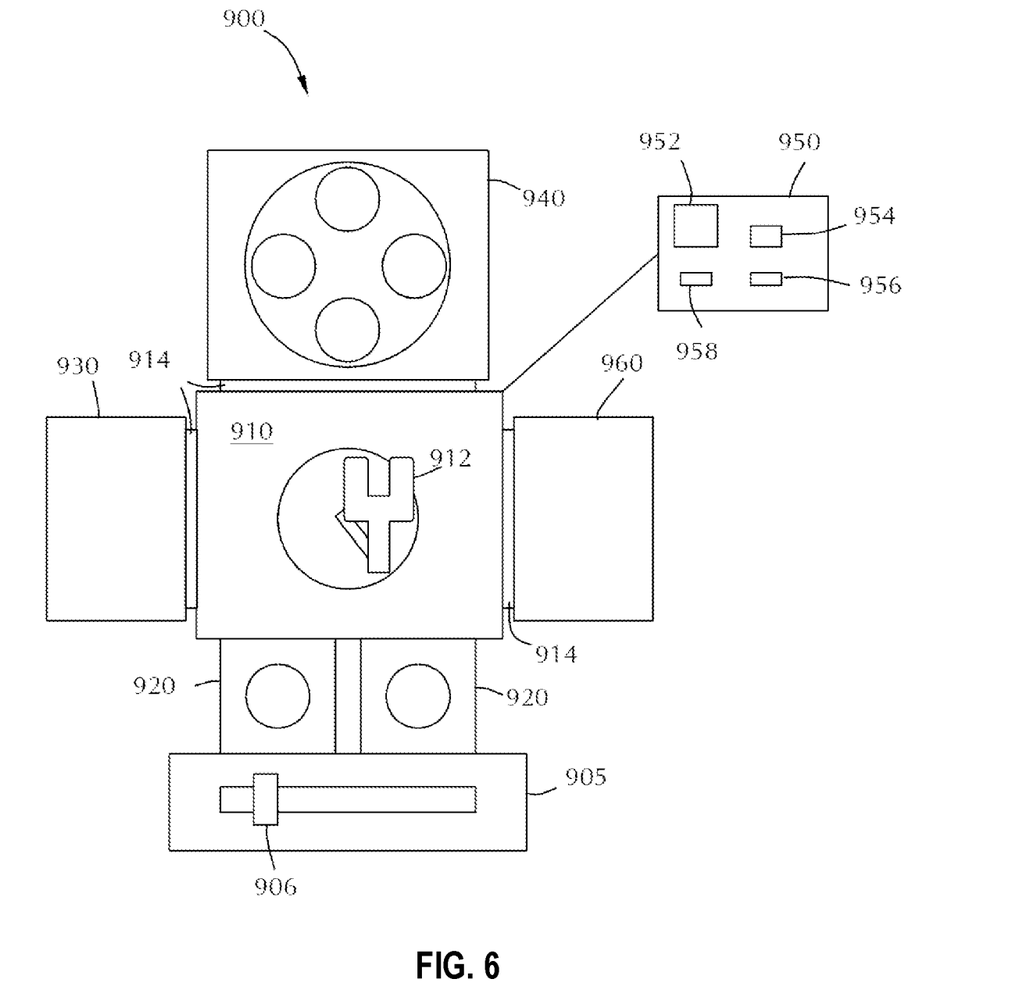
FIG. 6 illustrates a processing system for processing a substrate according to one or more embodiment of the disclosure.
Figure 7A:
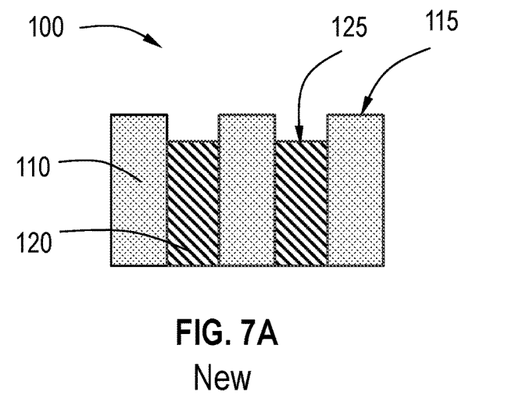
FIG. 7A-7E are cross-sectional and top views of an exemplary substrate during processing according to one or more embodiment of the disclosure.
Figure 7B:
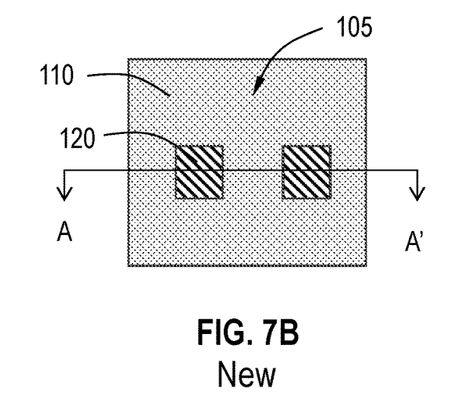
Figure 7C:
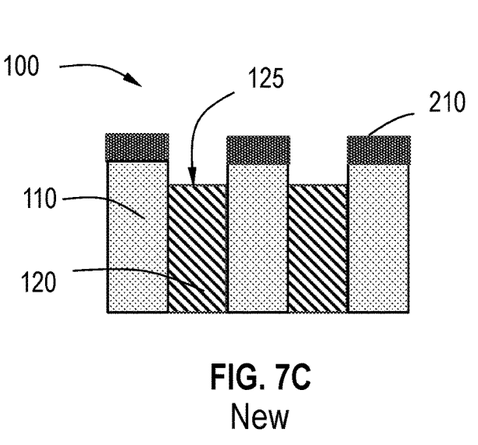
Figure 7D:
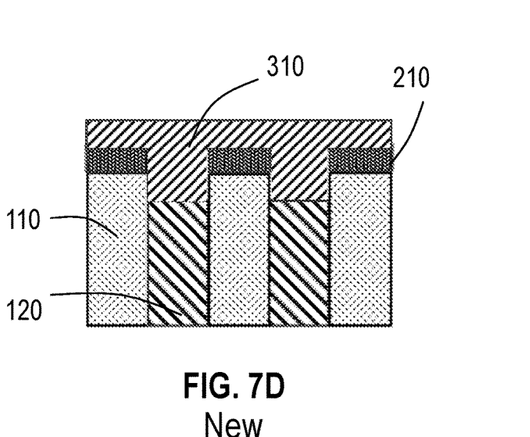
Figure 7E:
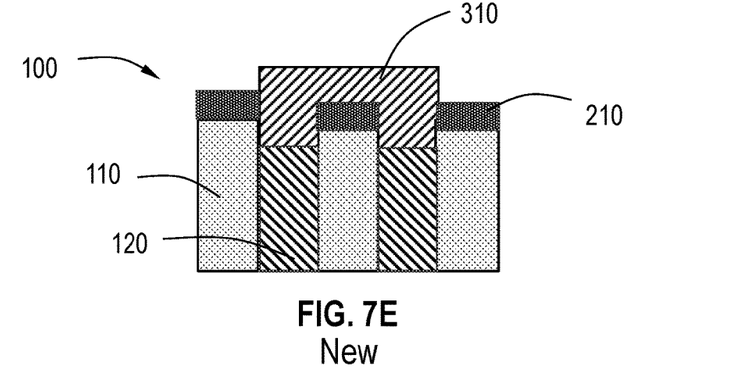

With reference to FIG. 6, additional embodiments of the disclosure are directed to a processing system 900 for executing the methods described herein. FIG. 6 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 6, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a selective deposition chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises a deposition chamber and is fluid communication with one or more reactive gas sources to provide flows of reactive gas to the processing chamber 940 to perform the isotropic etch process. The substrate can be moved to and from the processing chamber 940 by robot 912 passing through isolation valve 914.

In some embodiments, processing chamber 960 is connected to the central transfer station 910 and is configured to act as an etching chamber. The processing chamber 960 can be configured to perform one or more different epitaxial growth processes.

In some embodiments, each of the processing chambers 930, 940, and 960 are configured to perform different portions of the processing method. For example, processing chamber 930 may be configured to perform the selective deposition process for the etch stop layer, processing chamber 940 may be configured to perform the deposition process for the second metal material, and processing chamber 960 may be configured to perform an etching process to pattern the second metal material. The skilled artisan will recognize that the number and arrangement of individual processing chamber on the tool can be varied and that the embodiment illustrated in FIG. 6 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers; a configuration to load and/or unload substrates from the system; a configuration to selectively deposit the etch stop layer; a configuration to deposit the second metal material; a configuration to etch the second metal material; and/or a configuration to remove the etch stop layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method comprising:
selectively depositing an etch stop layer on a first dielectric material over a first metal material, the first dielectric material comprising a plurality of features formed therein with the first metal material within the plurality of features;
depositing a second metal material on the first metal material and the etch stop layer;
etching the second metal material to expose a portion of the etch stop layer; and
removing the portion of the etch stop layer exposed by etching the second metal material to expose a top surface of the first dielectric material,
wherein a top surface of the second metal material is higher than the exposed top surface of the first dielectric material.

2. The method of claim 1, wherein the first dielectric material consists essentially of a low-k dielectric.

3. The method of claim 1, wherein the first metal material consists essentially of copper.

4. The method of claim 1, wherein the etch stop layer is deposited with a selectivity greater than or equal to 5.

5. The method of claim 1, wherein the first metal material and the second metal material are the same material.

6. The method of claim 1, wherein at least one feature of the plurality of features is a via.

7. The method of claim 1, wherein the top surface of the first metal material is coplanar with a top surface of first dielectric material.

8. The method of claim 1, wherein the first metal material does not completely fill the plurality of features.

9. The method of claim 8, wherein the second metal material fills the plurality of features and is deposited on a top surface of the etch stop layer.

10. The method of claim 1, wherein selectively depositing the etch stop layer comprises:
exposing the first metal material to a blocking compound to form a passivated surface of the first metal material; and
depositing the etch stop layer on the first dielectric material over the passivated surface of the first metal material.

11. The method of claim 10, wherein the blocking compound comprises one or more of a phosphoric acid, alkyl silane, halogenated silane, thiol or unsaturated hydrocarbon.

12. The method of claim 10, further comprising removing the blocking compound from the passivated surface of the first metal material before depositing the second metal material.

13. The method of claim 12, wherein the blocking compound is removed by exposure to a plasma comprising $H_2$.

14. The method of claim 1, wherein the etch stop layer comprises tantalum nitride (TaN).

15. The method of claim 1, wherein the method forms a conductive path between the first metal material within at least two of the plurality of features.

16. The method of claim 1, wherein etching the second metal material comprises a photolithography process.

17. The method of claim 1, wherein the resistance between the first metal material and the second metal material is less than the resistance of a similar device formed with a non-selective (blanket) etch stop layer.

18. A method comprising:
exposing a first dielectric material to a blocking compound, the first dielectric material comprising a plurality of features formed therein and a first metal material within the plurality of features, wherein exposing the first dielectric material to the blocking compound forms a passivated surface of the first metal material;
selectively depositing an etch stop layer on the first dielectric material over the passivated surface of the first metal material;
removing the blocking compound from the passivated surface of first metal material;
depositing a second metal material on the first metal material and the etch stop layer after removing the blocking compound from the passivated surface of first metal material;
etching the second metal material by photolithography to expose a portion of the etch stop layer and form a conductive path between the first metal material within the plurality of features; and removing the portion of the etch stop layer exposed by etching the second metal material to expose a top surface of the first dielectric material, wherein a top surface of the second metal material is higher than the exposed top surface of the first dielectric material.

\* \* \* \* \*